(12) United States Patent
Masini et al.

(10) Patent No.: US 11,101,400 B2
(45) Date of Patent: Aug. 24, 2021

(54) METHOD AND SYSTEM FOR A FOCUSED FIELD AVALANCHE PHOTODIODE

(71) Applicant: Luxtera LLC., Wilmington, DE (US)

(72) Inventors: Gianlorenzo Masini, Carlsbad, CA (US); Kam-Yan Hon, Oceanside, CA (US); Subal Sahni, La Jolla, CA (US); Attila Mekis, Carlsbad, CA (US)

(73) Assignee: Luxtera LLC, Wilmington, DE (US)

( * ) Notice: Subject to any disclaimer, the term of this patent is extended or adjusted under 35 U.S.C. 154(b) by 0 days.

(21) Appl. No.: 16/184,169

(22) Filed: Nov. 8, 2018

(65) Prior Publication Data

US 2019/0165200 A1    May 30, 2019

Related U.S. Application Data

(60) Provisional application No. 62/591,303, filed on Nov. 28, 2017.

(51) Int. Cl.
*H01L 31/107* (2006.01)
*H01L 31/02* (2006.01)
*H01L 31/0232* (2014.01)
*H01L 31/147* (2006.01)

(52) U.S. Cl.
CPC .... *H01L 31/1075* (2013.01); *H01L 31/02027* (2013.01); *H01L 31/02327* (2013.01); *H01L 31/107* (2013.01); *H01L 31/147* (2013.01)

(58) Field of Classification Search
CPC ........ H01L 29/66113; H01L 31/02027; H01L 31/107–1075; H01L 31/035281
See application file for complete search history.

(56) References Cited

U.S. PATENT DOCUMENTS

| | | | |
|---|---|---|---|
| 6,359,322 B1 | 3/2002 | Haralson et al. | |
| 9,391,225 B1* | 7/2016 | Davids | G02B 6/02 |
| 9,705,023 B2* | 7/2017 | Yu | H01L 31/107 |

(Continued)

OTHER PUBLICATIONS

Notification of Transmittal of the International Search Report and the Written Opinion of the International Searching Authority, or The Declaration for PCT Application PCT/US18/61290; International Filing Date Nov. 15, 2018; dated Jan. 28, 2019.

(Continued)

*Primary Examiner* — Vincent Wall
(74) *Attorney, Agent, or Firm* — Patterson + Sheridan, LLP

(57) ABSTRACT

Systems and methods for a focused field avalanche photodiode (APD) may include an absorbing layer, an anode, a cathode, an N-doped layer, a P-doped layer, and a multiplication region between the N-doped layer and the P-doped layer. Oxide interfaces are located at top and bottom surfaces of the anode, cathode, N-doped layer, P-doped layer, and multiplication region. The APD may absorb an optical signal in the absorbing layer to generate carriers, and direct them to a center of the cathode using doping profiles in the N-doped layer and the P-doped layer that vary in a direction perpendicular to the top and bottom surfaces. The doping profiles in the N-doped layer and the P-doped layer may have a peak concentration midway between the oxide interfaces, or the N-doped layer may have a peak concentration midway between the oxide interfaces while the P-doped layer may have a minimum concentration there.

14 Claims, 9 Drawing Sheets

(56) References Cited

U.S. PATENT DOCUMENTS

| | | | | |
|---|---|---|---|---|
| 2006/0273421 A1* | 12/2006 | Yasuoka | ............. | H01L 31/0232 257/438 |
| 2009/0184384 A1* | 7/2009 | Sanfilippo | ......... | H01L 27/14629 257/432 |
| 2010/0163925 A1* | 7/2010 | Ishibashi | ............... | H01L 31/107 257/186 |
| 2010/0200781 A1* | 8/2010 | Khorasani | ......... | B01L 3/502715 250/576 |
| 2012/0329238 A1* | 12/2012 | Guan | ................. | H01L 27/0259 438/400 |
| 2013/0292741 A1* | 11/2013 | Huang | ............... | H01L 31/1075 257/186 |
| 2014/0186991 A1* | 7/2014 | Huang | ................. | H01L 31/107 438/91 |

OTHER PUBLICATIONS

PCT International Preliminary Report on Patentability for Application No. PCT/US2018/061290 dated Jun. 2, 2020.

\* cited by examiner

METHOD AND SYSTEM FOR A FOCUSED FIELD AVALANCHE PHOTODIODE

CROSS-REFERENCE TO RELATED APPLICATIONS/INCORPORATION BY REFERENCE

This application claims priority to and the benefit of U.S. Provisional Application No. 62/591,303 filed on Nov. 28, 2017, which is hereby incorporated herein by reference in its entirety.

FIELD

Aspects of the present disclosure relate to electronic components. More specifically, certain implementations of the present disclosure relate to methods and systems for a focused field avalanche photodiode.

BACKGROUND

Conventional approaches for avalanche photodetectors may be costly, cumbersome, and/or inefficient—e.g., they may be complex and/or time consuming, and/or may result in unreliable devices.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for a focused field avalanche photodiode, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry or a device is "operable" to perform a function whenever the circuitry or device comprises the necessary hardware and code (if any is necessary) to perform the function, regardless of whether performance of the function is disabled or not enabled (e.g., by a user-configurable setting, factory trim, etc.).

Figure 1A:
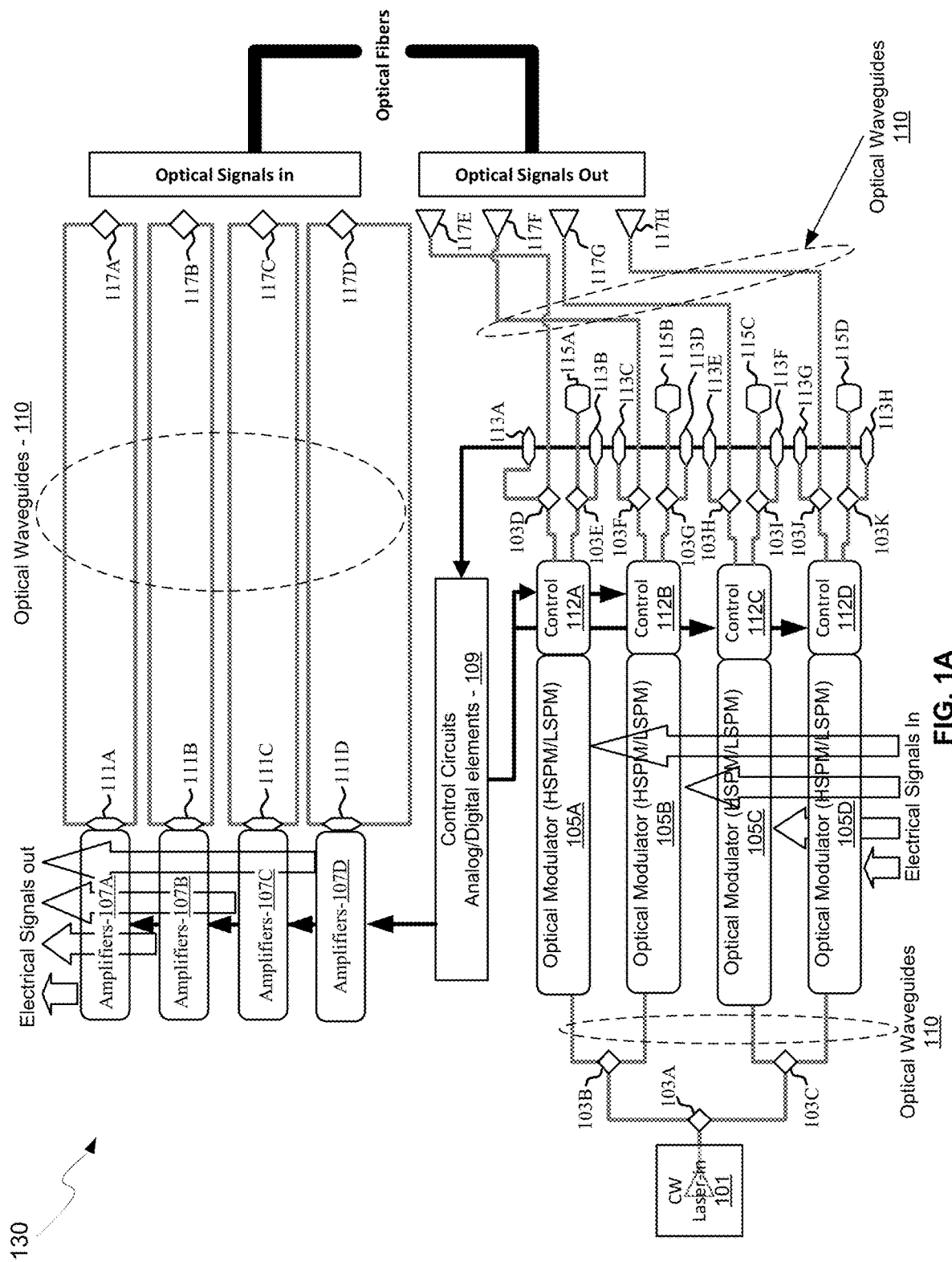
FIG. 1A is a block diagram of a photonically-enabled integrated circuit with a focused field avalanche photodiode, in accordance with an example embodiment of the disclosure.

FIG. 1A is a block diagram of a photonically-enabled integrated circuit with focused field avalanche photodiodes, in accordance with an example embodiment of the disclosure. Referring to FIG. 1A, there is shown optoelectronic devices on a photonically-enabled integrated circuit 130 comprising optical modulators 105A-105D, photodiodes 111A-111D, monitor photodiodes 113A-113H, and optical devices comprising couplers 103A-103K, optical terminations 115A-115D, and grating couplers 117A-117H. There are also shown electrical devices and circuits comprising amplifiers 107A-107D, analog and digital control circuits 109, and control sections 112A-112D. The amplifiers 107A-107D may comprise transimpedance amplifiers (TIAs), limiting amplifiers (LAs), analog-to-digital converters (ADCs), and/or digital signal processors (DSPs), for example.

In an example scenario, the photonically-enabled integrated circuit 130 comprises a CMOS photonics die with a laser assembly 101 coupled to the top surface of the IC 130. The laser assembly 101 may comprise one or more semiconductor lasers with isolators, lenses, and/or rotators within for directing one or more CW optical signals to the coupler 103A. The photonically enabled integrated circuit 130 may comprise a single chip, or may be integrated on a plurality of die, such as with one or more electronics die and one or more photonics die.

Optical signals are communicated between optical and optoelectronic devices via optical waveguides 110 fabricated in the photonically-enabled integrated circuit 130.

Single-mode or multi-mode waveguides may be used in photonic integrated circuits. Single-mode operation enables direct connection to optical signal processing and networking elements. The term "single-mode" may be used for waveguides that support a single mode for each of the two polarizations, transverse-electric (TE) and transverse-magnetic (TM), or for waveguides that are truly single mode and only support one mode whose polarization is TE, which comprises an electric field parallel to the substrate supporting the waveguides. Two typical waveguide cross-sections that are utilized comprise strip waveguides and rib waveguides. Strip waveguides typically comprise a rectangular cross-section, whereas rib waveguides comprise a rib section on top of a waveguide slab. Of course, other waveguide cross section types are also contemplated and within the scope of the disclosure.

In an example scenario, the couplers 103A-103C may comprise low-loss Y-junction power splitters where coupler 103A receives an optical signal from the laser assembly 101 and splits the signal to two branches that direct the optical signals to the couplers 103B and 103C, which split the optical signal once more, resulting in four roughly equal power optical signals.

The optical power splitter may comprise at least one input waveguide and at least two output waveguides. The couplers 103A-103C shown in FIG. 1A illustrates 1-by-2 splitters, which divide the optical power in one waveguide into two other waveguides evenly. These Y-junction splitters may be used in multiple locations in an optoelectronic system, such as in a Mach-Zehnder interferometer (MZI) modulator, e.g., the optical modulators 105A-105D, where a splitter and a combiner are needed, since a power combiner can be a splitter used in reverse.

In another example scenario, the Y-junction may be utilized in a parallel multi-channel transmitter, where a cascade of 1-by-2 splitters can be employed to have a single light source feed multiple channels. Interleaver-based multiplexers and demultiplexers constitute a third example where 1-by-2 splitters are among the building blocks.

The optical modulators 105A-105D comprise Mach-Zehnder or ring modulators, for example, and enable the modulation of the continuous-wave (CW) laser input signal. The optical modulators 105A-105D may comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

In an example scenario, the high-speed optical phase modulators may operate based on the free carrier dispersion effect and may demonstrate a high overlap between the free carrier modulation region and the optical mode. High-speed phase modulation of an optical mode propagating in a waveguide is the building block of several types of signal encoding used for high data rate optical communications. Speed in the several Gb/s may be required to sustain the high data rates used in modern optical links and can be achieved in integrated Si photonics by modulating the depletion region of a PN junction placed across the waveguide carrying the optical beam. In order to increase the modulation efficiency and minimize the loss, the overlap between the optical mode and the depletion region of the PN junction must be carefully optimized.

The outputs of the optical modulators 105A-105D may be optically coupled via the waveguides 110 to the grating couplers 117E-117H. The couplers 103D-103K may comprise four-port optical couplers, for example, and may be utilized to sample or split the optical signals generated by the optical modulators 105A-105D, with the sampled signals being measured by the monitor photodiodes 113A-113H. The unused branches of the directional couplers 103D-103K may be terminated by optical terminations 115A-115D to avoid back reflections of unwanted signals.

The grating couplers 117A-117H comprise optical gratings that enable coupling of light into and out of the photonically-enabled integrated circuit 130. The grating couplers 117A-117D may be utilized to couple light received from optical fibers into the photonically-enabled integrated circuit 130, and the grating couplers 117E-117H may be utilized to couple light from the photonically-enabled integrated circuit 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

The optical fibers may be epoxied, for example, to the CMOS chip, and may be aligned at an angle from normal to the surface of the photonically-enabled integrated circuit 130 to optimize coupling efficiency. In an example embodiment, the optical fibers may comprise single-mode fiber (SMF) and/or polarization-maintaining fiber (PMF).

Figure 1B:
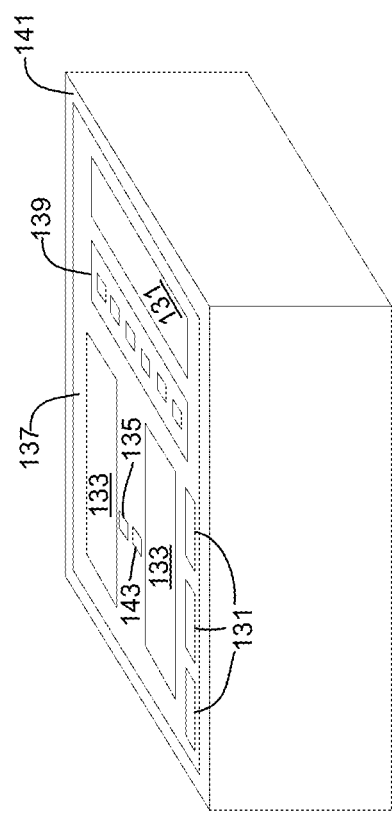
FIG. 1B is a diagram illustrating an example photonically-enabled integrated circuit, in accordance with an example embodiment of the disclosure.
Figure 1B:
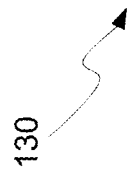

In another example embodiment illustrated in FIG. 1B, optical signals may be communicated directly into the surface of the photonically-enabled integrated circuit 130 without optical fibers by directing a light source on an optical coupling device in the chip, such as the light source interface 135 and/or the optical fiber interface 139. This may be accomplished with directed laser sources and/or optical sources on another chip flip-chip bonded to the photonically-enabled integrated circuit 130.

The photodiodes 111A-111D may convert optical signals received from the grating couplers 117A-117D into electrical signals that are communicated to the amplifiers 107A-107D for processing. In an example embodiment of the disclosure, the photodiodes 111A-111D comprise high-speed focused field waveguide avalanche photodiodes (WAPDs), for example, and may comprise germanium (Ge) in their absorbing layers for absorption in the 1.2-1.6 µm optical wavelength range, and may be integrated on a CMOS silicon-on-insulator (SOI) wafer.

As the speed of optoelectronic transmitters increase, photodetector speed must be improved for overall system performance. In an example embodiment of the disclosure, focused field WAPDs are described for receiving optical signals from a plurality of waveguides, as shown further with respect to FIGS. 2-9.

Avalanche Photodiodes (APD) are attractive for high speed optical communication due to their high gain and bandwidth. Separate Absorption Charge and Multiplication (SACM-APD) devices, in particular, combine the high absorption efficiency at the telecom wavelengths of narrow bandgap materials with the low noise performance of Si, enabling unmatched receiver sensitivity.

Waveguide photodetectors represent are useful in applications where high speed and high efficiency are needed because they break the efficiency/speed tradeoff of surface illuminated photodetectors. This is due to the light travelling and being absorbed perpendicularly to the photo-carrier flow, thus allowing independent optimization of absorption efficiency and transit time.

Waveguide Ge-on-Si SACM-APDs combine the high speed/efficiency performance of the waveguide configuration with the excellent gain characteristics of silicon, thus enabling high sensitivity at high data rates.

The analog and digital control circuits 109 may control gain levels or other parameters in the operation of the amplifiers 107A-107D, which may then communicate electrical signals off the photonically-enabled integrated circuit 130. In addition, the control system 109 may adjust the bias voltage across the APDs to tune the gain/bandwidth according to environmental conditions and link needs.

The control sections 112A-112D comprise electronic circuitry that enable modulation of the CW laser signal received from the splitters 103A-103C. The optical modulators 105A-105D may require high-speed electrical signals to modulate the refractive index in respective branches of a Mach-Zehnder interferometer (MZI), for example. In an example embodiment, the control sections 112A-112D may include sink and/or source driver electronics that may enable a bidirectional link utilizing a single laser.

In operation, the photonically-enabled integrated circuit 130 may be operable to transmit and/or receive and process optical signals. Optical signals may be received from optical fibers by the grating couplers 117A-117D and converted to electrical signals by the photodetectors 111A-111D. The electrical signals may be amplified by transimpedance amplifiers in the amplifiers 107A-107D, for example, and subsequently communicated to other electronic circuitry, not shown, in the photonically-enabled integrated circuit 130.

Integrated photonics platforms allow the full functionality of an optical transceiver to be integrated on a single chip. An optical transceiver chip contains optoelectronic circuits that create and process the optical/electrical signals on the transmitter (Tx) and the receiver (Rx) sides, as well as optical interfaces that couple the optical signals to and from a fiber. The signal processing functionality may include modulating the optical carrier, detecting the optical signal, splitting or combining data streams, and multiplexing or demultiplexing data on carriers with different wavelengths.

The operation of APDs is based on the generation of hot carriers by a large applied field. The hot carriers produce new electron-hole pairs by impact ionization. The carriers so generated, in turn, are accelerated by the field and trigger more impact ionization events in an avalanche process. However, when avalanche occurs in the proximity of a semiconductor-dielectric interface, hot carriers can be injected into the dielectric where they get trapped and build up a fixed charge. The charge build-up, with time, modifies the electric field profile within the active region of the device, resulting in performance degradation. This phenomenon, commonly referred to as Hot Carrier Injection (HCI), is observed, as an example, in proximity of the drain of modern MOSFETs and represents a common degradation factor for these devices.

In order to minimize HCI, a special configuration for the cathode and the charge layers of the waveguide APD may be utilized, as described in this disclosure. Example devices and results are shown in FIGS. 2-9.

FIG. 1B is a diagram illustrating an example photonically-enabled integrated circuit, in accordance with an example embodiment of the disclosure. Referring to FIG. 1B, there is shown the photonically-enabled integrated circuit 130 comprising electronic devices/circuits 131, optical and optoelectronic devices 133, a light source interface 135, a chip front surface 137, an optical fiber interface 139, CMOS guard ring 141, and a surface-illuminated monitor photodiode 143.

The light source interface 135 and the optical fiber interface 139 comprise grating couplers, for example, that enable coupling of light signals via the CMOS chip surface 137, as opposed to the edges of the chip as with conventional edge-emitting/receiving devices. Coupling light signals via the chip surface 137 enables the use of the CMOS guard ring 141 which protects the chip mechanically and prevents the entry of contaminants via the chip edge. In another example scenario, photonic devices may be integrated on a photonics die while electronic devices are integrated on one or more electronic die, which may be bonded to the photonic die.

The electronic devices/circuits 131 comprise circuitry such as the amplifiers, ADCs, DSPs 107A-107D and the analog and digital control circuits 109 described with respect to FIG. 1A, for example. The optical and optoelectronic devices 133 comprise devices such as the couplers 103A-103K, optical terminations 115A-115D, grating couplers 117A-117H, optical modulators 105A-105D, WAPDs 111A-111D, and monitor photodiodes 113A-113I.

Figure 1C:
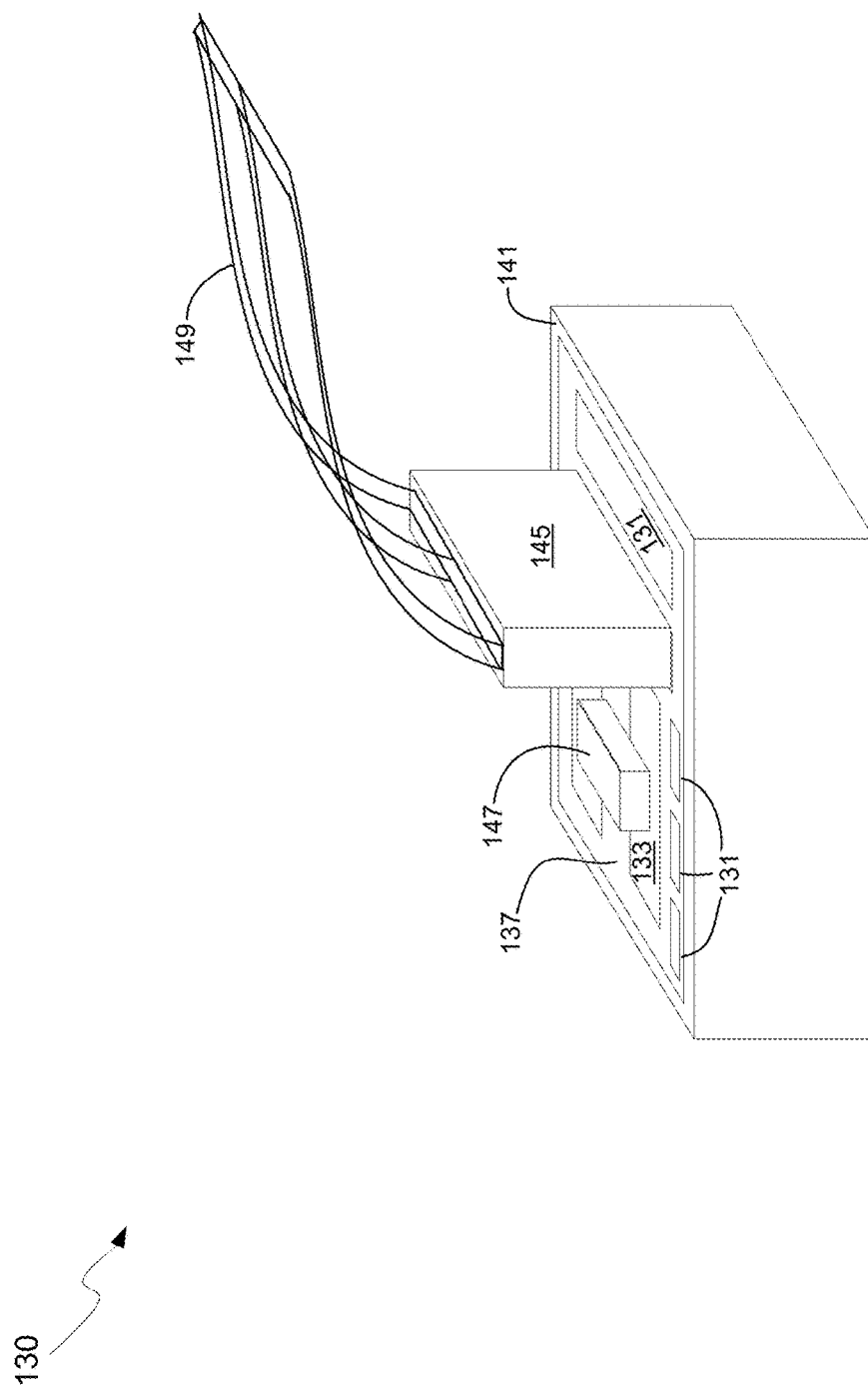
FIG. 1C is a diagram illustrating a photonically-enabled integrated circuit coupled to an optical fiber cable, in accordance with an example embodiment of the disclosure.

FIG. 1C is a diagram illustrating a photonically-enabled integrated circuit coupled to an optical fiber cable, in accordance with an example embodiment of the disclosure. Referring to FIG. 1C, there is shown the photonically-enabled integrated circuit 130 comprising the chip surface 137, and the CMOS guard ring 141. There is also shown a fiber-to-chip coupler 145, an optical fiber cable 149, and an optical source assembly 147.

The photonically-enabled integrated circuit 130 comprises the electronic devices/circuits 131, the optical and optoelectronic devices 133, the light source interface 135, the chip surface 137, and the CMOS guard ring 141 may be as described with respect to FIG. 1B.

In an example embodiment, the optical fiber cable may be affixed, via epoxy for example, to the CMOS chip surface 137. The fiber chip coupler 145 enables the physical coupling of the optical fiber cable 149 to the photonically-enabled integrated circuit 130.

Figure 2:
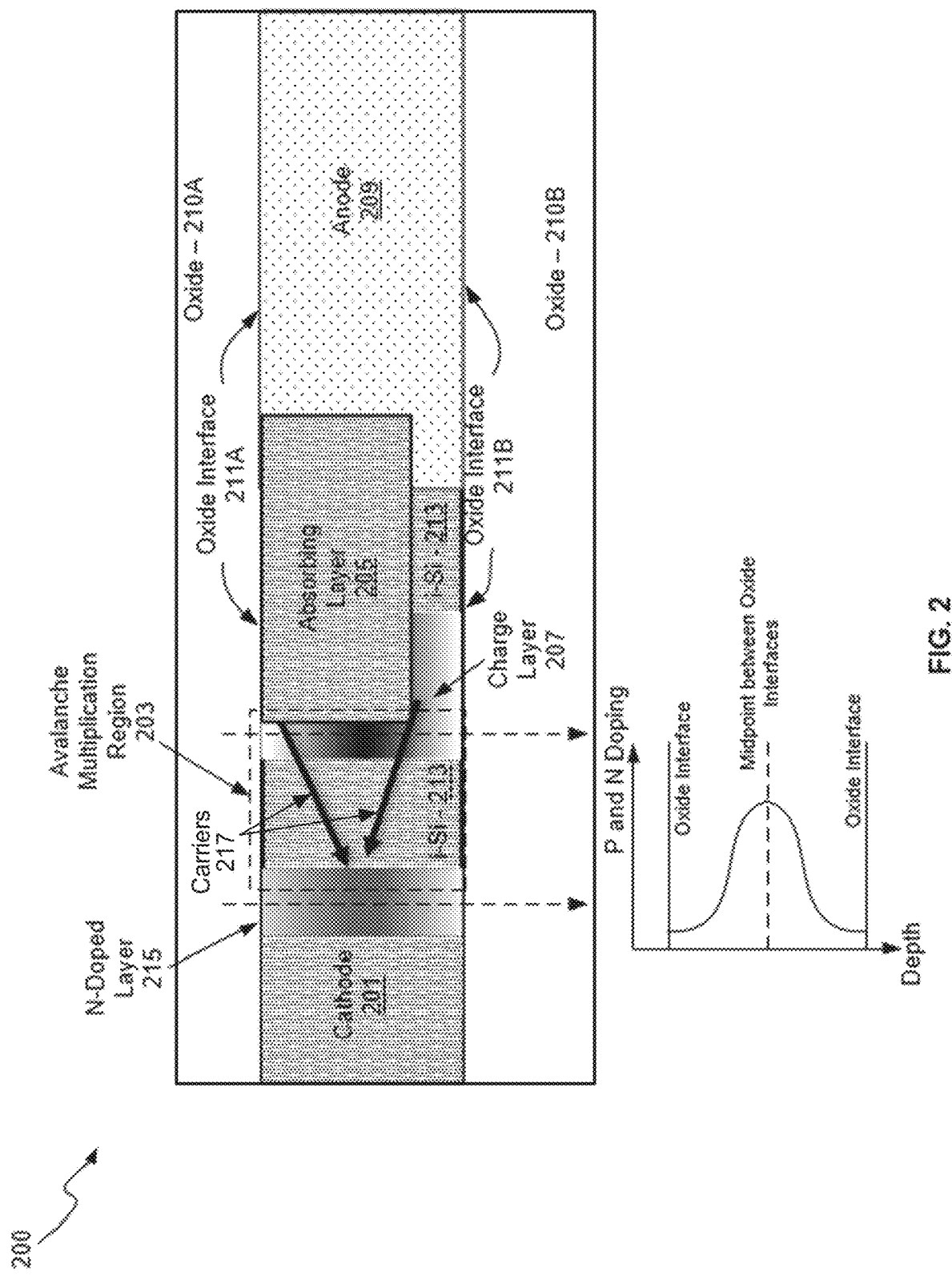
FIG. 2 shows a device cross-section illustrating the focused field avalanche photodiode concept, in accordance with an example embodiment of the disclosure.

FIG. 2 shows a device cross-section illustrating the focused field avalanche photodiode concept, in accordance with an example embodiment of the disclosure. With reference to FIG. 2, there is shown focused field APD 200 comprising a highly doped cathode 201, a highly doped anode 209, an absorbing layer 205, typically germanium, and an avalanche multiplication region 203. In this example, the cathode 201 is doped N+ while the anode is doped P+. The APD 200 may comprise a waveguide photodiode, in that input optical signals may be received into/out of the plane of the device as shown in FIG. 2, while photo-generated carriers 217 are accelerated laterally.

The oxide interfaces 211A and 211B indicate boundaries between the semiconductor layer used for the APD 200 and a buried oxide 210B and a top passivating oxide layer 210A. A focusing field may be generated by configuring the doping, typically through ion implantation, for example, to peak midway between the oxide interfaces. The resulting electric field in the avalanche multiplication region of the APD is therefore focused in the center and keeps the hot carriers (that is, the photo-generated carriers 217 when accelerated) away from the top and bottom oxide interfaces.

The APD 200 also comprises intrinsic, or lightly doped, regions 213, which may be regions of the silicon layer of the SOI substrate that are not doped or may have light doping. The APD 200 also comprises charge layer 207, which is a region between and below the absorbing layer 205 doped P-type, where the photo-generated carriers 217 are accelerated towards the avalanche multiplication region 203.

As shown in the example APD of FIG. 2, the cathode implant may be targeted to the midpoint of the SOI, i.e., midway between the oxide interfaces 211A and 211B. A similar approach may be used for the charge layer 207 adjacent to the absorbing layer 205, embedding the left side of the Ge absorption region 205. The doping in the N-doped layer 215 and charge layer 207 therefore comprise vertical implant profiles, as shown in the doping vs depth inset at the bottom of FIG. 2, showing a peak in concentration at the midpoint between the top and bottom surfaces, which keeps the hot carriers away from the top and bottom Si/oxide interfaces. Typical doping concentrations for the cathode and charge layer may be configured in the $10^{19}$ cm$^{-3}$ and $10^{17}$ cm$^{-3}$ range, respectively.

In operation, an optical signal received in the APD 200 from a direction into or out of the plane of the cross-section shown is absorbed in the absorbing layer 205 thereby generating photoelectrons, which are emitted from the Ge absorbing layer 205 and accelerate around the p-type charge layer 207, i.e., travel from the top and bottom regions of the charge layer 207. The high electric field accelerates the photoelectrons towards the tip of the cathode implant in the N-doped layer 215. The region between the narrow n-type layer 215 on the cathode side and the p-type charge layer 207 at the cathode side of the Ge absorption layer 205 comprise the avalanche multiplication region 203, where energetic electrons generate more electrons, thereby providing multiplication of the photo-generated carriers 217 and thus increased photo-generated current. In this structure, hot carrier injection is therefore reduced by "focusing" the highly energetic photo-generated carriers 217 in the avalanche multiplication region 203 in the center of the region away from the edges comprising the oxide interfaces 211A and 211B.

Figure 3:
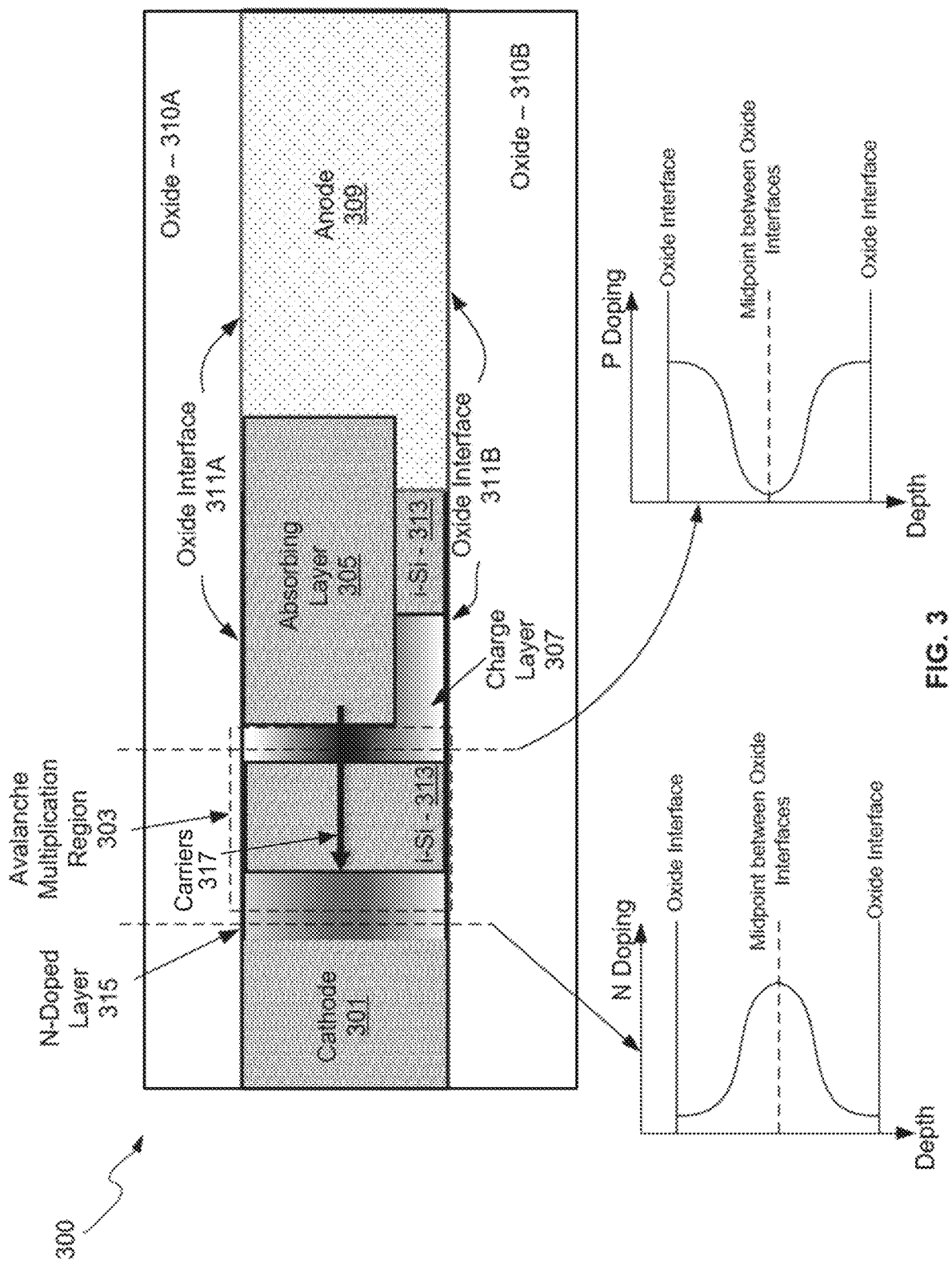
FIG. 3 illustrates an alternative implementation of the focused field avalanche photodiode concept, in accordance with an example embodiment of the disclosure.

FIG. 3 illustrates an alternative implementation of the focused field avalanche photodiode concept, in accordance with an example embodiment of the disclosure. With reference to FIG. 3, there is shown focused field APD 300 comprising a highly doped anode 309, a highly doped cathode 301, an absorbing layer 305, typically germanium, and an avalanche multiplication region 303. In this example, the cathode 301 is doped N+ while the anode 309 is doped P+. The APD 300 may comprise a waveguide photodiode, in that input optical signals may be received into or out of the cross-sectional plane of the device as shown in FIG. 3, while photo-generated carriers 317 are accelerated laterally.

The oxide interfaces 311A and 311B indicate boundaries between the semiconductor layer used for the APD 300 and a buried oxide 310B and a top passivating oxide layer 310A. A focusing field may be generated by configuring the doping, typically through ion implantation, for example, to peak midway between the oxide interfaces and/or at the top and bottom near the interfaces. The resulting electric field in the avalanche multiplication region of the APD is therefore focused in the center and keeps the hot carriers (that is, the photo-generated carriers 317 when accelerated) away from the top and bottom oxide interfaces.

In the alternative configuration shown in FIG. 3, the charge layer 307 implant is split into two implants, a first that is very shallow and a second that is targeted to the Si/BOX interface, i.e., the oxide interface 311B. This configuration creates a preferred path for the photogenerated electrons through the vertical center of the device, i.e., midway between the oxide interfaces, thus keeping them far from the oxide interfaces 311A and 311B throughout their full path. The cathode side implant is still a single implant targeted to the center of the SOI, while the charge layer is made by two implants: one very shallow and the second targeted to the Si/BOX interface, as illustrated by the doping profiles below the APD 300 in FIG. 3.

In this configuration, the photo-generated electrons injected from the Ge absorbing layer 305 pass into the avalanche multiplication region 303 in the center of the SOI film. The full current path in silicon therefore is kept away from the two semiconductor/dielectric interfaces, i.e. the oxide interfaces 311A and 311B. Typical doping densities for the cathode and charge layer may be configured in the $10^{19}$ cm$^{-3}$ and $10^{17}$ cm$^{-3}$ range, respectively, for example.

In operation, an optical signal received in the APD 300 from a direction into or out of the plane of the cross-section shown is absorbed in the absorbing layer 305 thereby generating photoelectrons, which are emitted from the Ge absorbing layer 305 and accelerate through the center of the p-type charge layer 307 where the high electric field accelerates the photoelectrons into the cathode implant in the N-doped layer 315. The region between the narrow n-type layer 315 on the cathode side and the p-type charge layer 307 at the cathode side of the Ge absorption layer 305 comprise the avalanche multiplication region 303, where energetic electrons generate more electrons, thereby providing multiplication of the photo-generated carriers 317 and thus increased photo-generated current. In this structure, hot carrier injection is therefore reduced by "focusing" the highly energetic photo-generated carriers 317 in the avalanche multiplication region 303 in the center of the region away from the edges comprising the oxide interfaces 311A and 311B.

Figure 4:
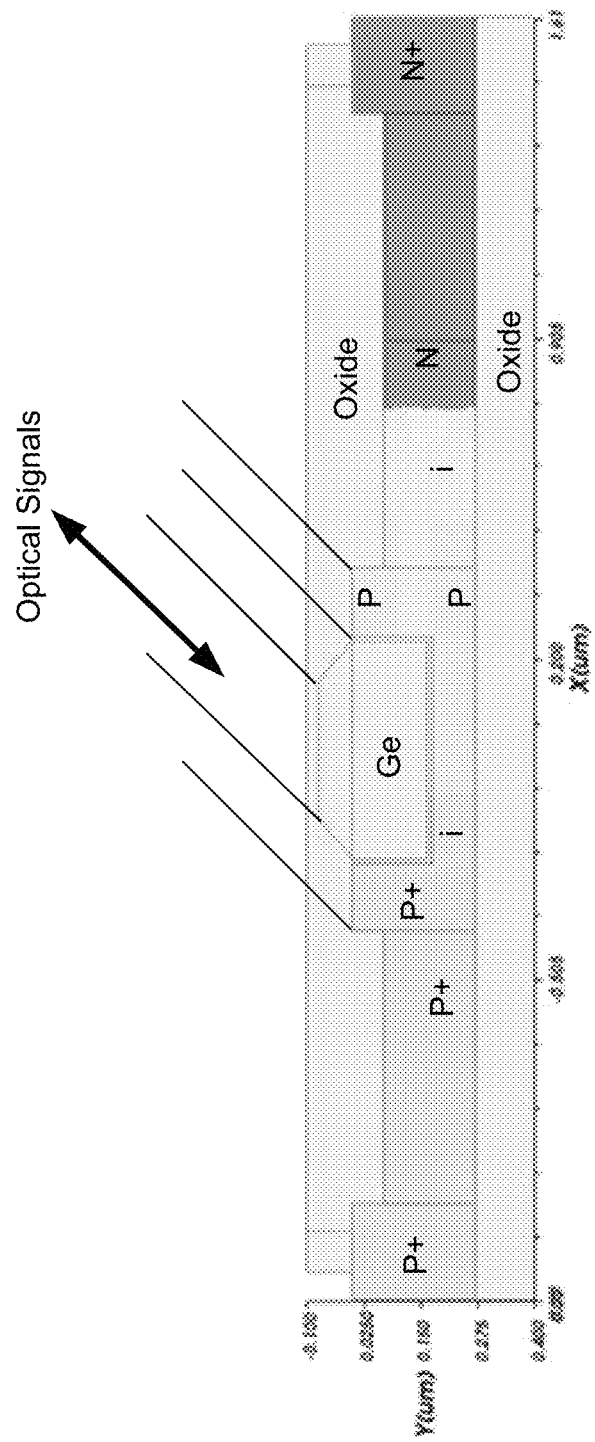
FIG. 4 illustrates a three-dimensional view of a waveguide avalanche photodiode and the doping structure used in a focused field avalanche photodiode simulation, in accordance with an example embodiment of the disclosure.

FIG. 4 illustrates a three-dimensional view of a waveguide avalanche photodiode and the doping structure used in a focused field avalanche photodiode simulation, in accordance with an example embodiment of the disclosure. Referring to FIG. 4, there is shown the doping profile for a focused field APD, which is mirrored structure to that of FIG. 2, with the P+ anode on the left and N+ cathode on the right. Furthermore, the varying doping profiles surrounding the intrinsic multiplication region are indicated by the centered "N" in the N region and "P" at the top and bottom in the P-region, as described with respect to FIG. 2. The waveguide structure of the APD is also shown by the lines extending out from the diode region and the direction of incoming optical signals as shown.

Figure 5:
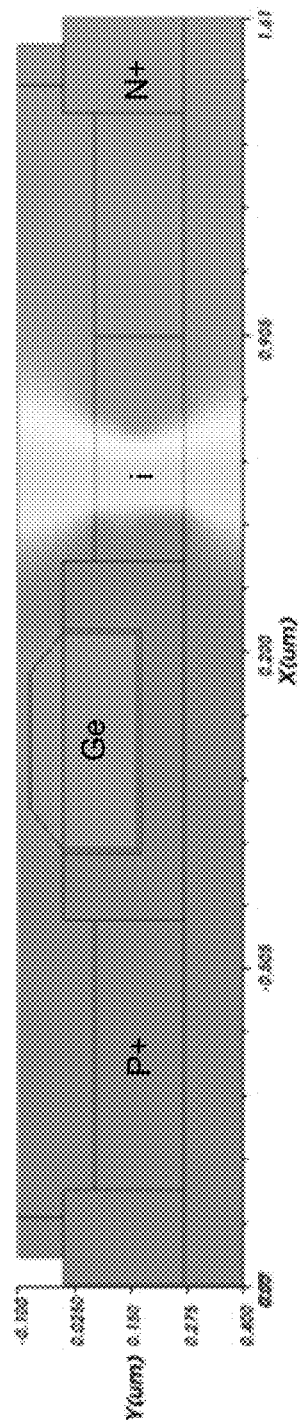
FIG. 5 illustrates the simulated potential profile in a focused field avalanche photodiode, in accordance with an example embodiment of the disclosure.

FIG. 5 illustrates the simulated potential profile in a focused field avalanche photodiode, in accordance with an example embodiment of the disclosure. Referring to FIG. 5, the potential of the P-i-P-i-N diode structure is shown under reverse bias by the change in shading from the higher potential N+ side through the intrinsic region where the potential transitions down to that of the P+ side.

Figure 6:
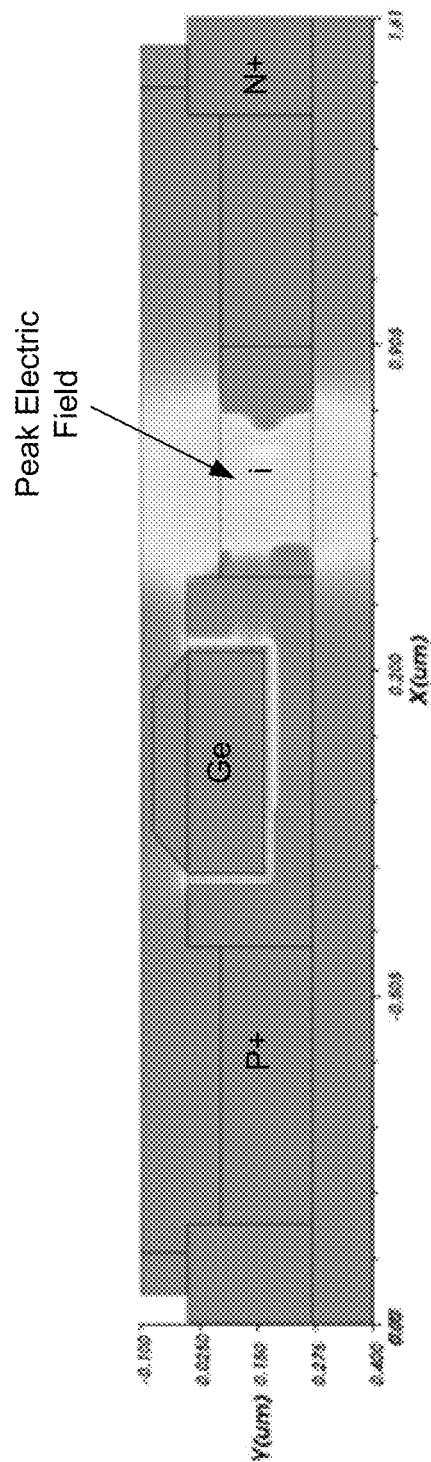
FIG. 6 illustrates the electric field in a focused field avalanche photodiode, in accordance with an example embodiment of the disclosure.

FIG. 6 illustrates the electric field in a focused field avalanche photodiode, in accordance with an example embodiment of the disclosure. Referring to FIG. 6, the electric field throughout the APD is shown with the highest field being in the i-region of the APD coinciding with the multiplication region of the device. Narrow higher field regions also surround the Ge layer, due to the field generated by the heterointerface between the Ge and Si, and are tunnel hetero-junctions due to the high level of doping, and no avalanche multiplication is occurring there.

Figure 7:
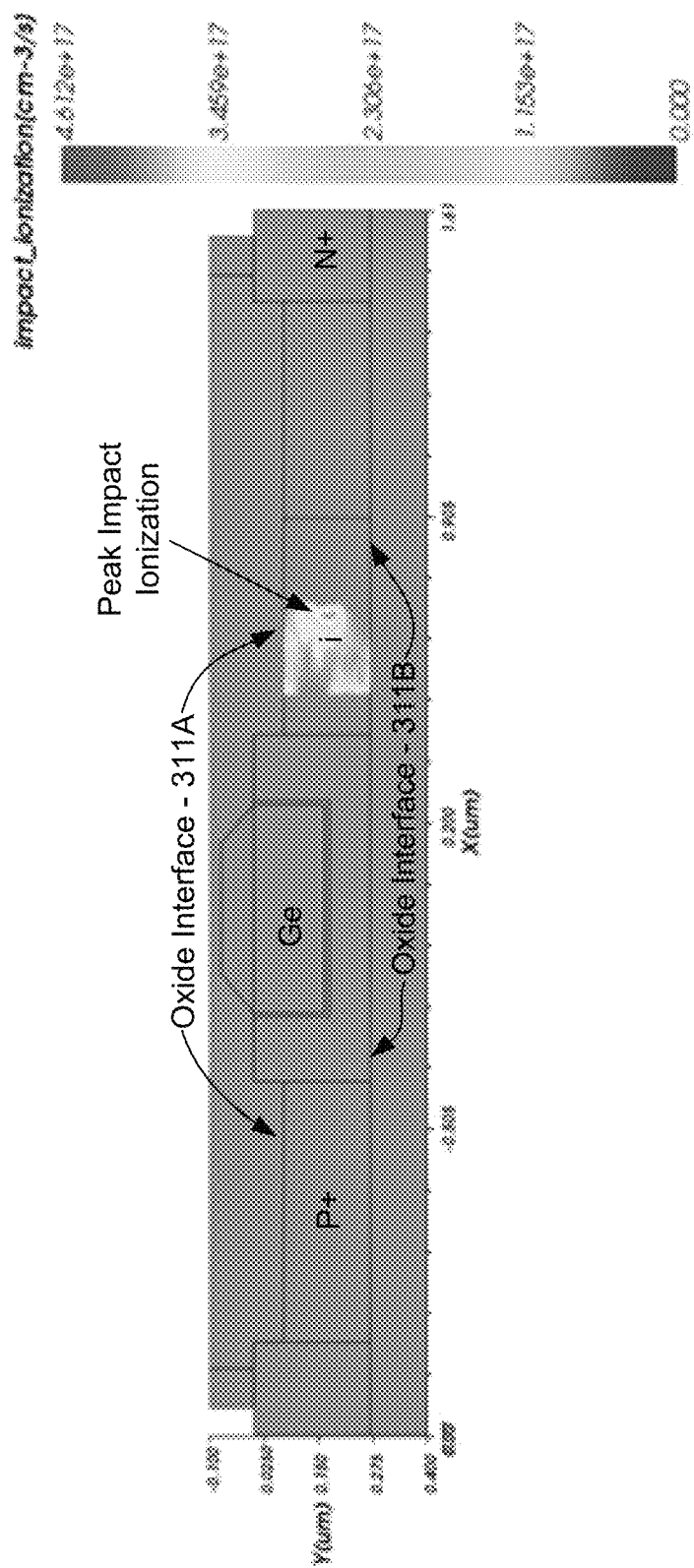
FIG. 7 illustrates the impact ionization profile for the focused field avalanche photodiode, in accordance with an example embodiment of the disclosure.

FIG. 7 illustrates the impact ionization profile for the focused field avalanche photodiode, in accordance with an example embodiment of the disclosure. More specifically, the impact ionization profile corresponds to the electric field of FIG. 6. As shown in FIG. 7, it can be seen that the impact ionization probability peaks in the multiplication region in the center of the SOI, away from the oxide interfaces 311A and 311B, thereby reducing hot carrier injection.

In an example embodiment of the disclosure, a method and system is described for a focused field avalanche photodiode. The system may comprise an avalanche photodiode comprising an absorbing layer, an anode, a cathode, an N-doped layer, a P-doped layer, and a multiplication region between the N-doped layer and the P-doped layer. Oxide interfaces are located at top and bottom surfaces of the anode, cathode, N-doped layer, P-doped layer, and multiplication region. The avalanche photodiode is operable to absorb a received optical signal in the absorbing layer to generate carriers, and direct the carriers to a center of the cathode using doping profiles in the N-doped layer and the P-doped layer that vary in a direction perpendicular to the top and bottom surfaces of the N-doped layer and the P-doped layer.

The doping profiles in the N-doped layer and the P-doped layer may have a peak concentration midway between the oxide interfaces. The doping profile in the N-doped layer may have a peak concentration midway between the oxide interfaces while the doping profile in the P-doped layer may have a minimum concentration midway between the oxide interfaces. The avalanche photodiode may comprise a waveguide photodiode.

The absorbing layer may comprise germanium, and the N-doped layer and the P-doped layer may comprise silicon. The P-doped layer may be between the multiplication region and absorbing layer and also below the absorbing layer. An intrinsic or lightly doped layer may also be below the absorbing layer. The avalanche photodiode may multiply the carriers through impact ionization that is centered between the top and bottom surfaces of the N-doped layer. The avalanche photodiode may be in a complementary metal oxide semiconductor (CMOS) die.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communication, the method comprising:
    in an avalanche photodiode formed in a silicon layer of a silicon-on-insulator (SOI) substrate, the avalanche photodiode comprising an absorbing region of germanium deposited in the silicon layer, the avalanche photodiode further comprising an anode, a cathode, an N-doped region, a P-doped charge region that extends beneath the absorbing region, and a multiplication region that are defined in silicon of the silicon layer, wherein the multiplication region is arranged between the N-doped region and the P-doped charge region, wherein oxide interfaces are at opposing surfaces above and below the silicon layer and contact the anode and the cathode:
        absorbing a received optical signal in the absorbing region to generate carriers; and
        directing the carriers through the P-doped charge region, the multiplication region, and the N-doped region toward a center of the cathode defined along a height of the silicon layer between the opposing surfaces using doping profiles in the N-doped region and the P-doped charge region that vary along the height.

2. The method according to claim 1, wherein the doping profiles in the N-doped region and the P-doped charge region have a peak concentration at a center height of the silicon layer.

3. The method according to claim 1, wherein the doping profile in the N-doped region has a peak concentration at the center height, and wherein the doping profile in the P-doped charge region has a minimum concentration at the center height.

4. The method according to claim 1, wherein the avalanche photodiode comprises a waveguide photodiode.

5. The method according to claim 1, wherein the P-doped charge region directly contacts the multiplication region and lateral and bottom surfaces of the absorbing region.

6. The method according to claim 5, wherein the P-doped charge region also directly contacts a lateral surface of an intrinsic or lightly doped layer that is arranged below the absorbing region.

7. The method according to claim 1, further comprising:
    multiplying the carriers through impact ionization that is centered at a center height of the silicon layer.

8. An apparatus comprising:
    an avalanche photodiode formed in a silicon layer of a silicon-on-insulator (SOI) substrate, the avalanche photodiode comprising:
        an absorbing region of germanium deposited in the silicon layer; and
        an anode, a cathode, an N-doped region, a P-doped charge region that extends beneath the absorbing region, and a multiplication region that are defined in silicon of the silicon layer, wherein the multiplication region is arranged between the N-doped region and the P-doped charge region;
    a first oxide layer contacting a top surface of the silicon layer, wherein the first oxide layer contacts the anode and the cathode; and
    a second oxide layer contacting a bottom surface of the silicon layer, wherein the second oxide layer contacts the anode and the cathode,
    wherein doping profiles in the N-doped region and the P-doped charge region vary along a height of the silicon layer between the top surface and the bottom surface, and
    wherein, as carriers are directed through the P-doped charge region, the multiplication region, and the N-doped region toward the cathode, the doping profiles direct the carriers toward a center of the cathode defined along the height of the silicon layer.

9. The apparatus of claim 8, wherein the doping profiles in the N-doped region and the P-doped charge region have a peak concentration at a center height of the silicon layer.

10. The apparatus of claim 8,
    wherein the doping profile in the N-doped region has a peak concentration at the center height, and
    wherein the doping profile in the P-doped charge region has a minimum concentration at the center height.

11. The apparatus of claim 8, wherein the avalanche photodiode comprises a waveguide photodiode.

12. The apparatus of claim 8,
    wherein the P-doped charge region directly contacts the multiplication region and lateral and bottom surfaces of the absorbing region.

13. The apparatus of claim 12, wherein the P-doped charge region also directly contacts a lateral surface of an intrinsic or lightly doped layer that is arranged below the absorbing region.

14. The apparatus of claim 8, wherein the multiplication region is configured to multiply the carriers through impact ionization that is centered at a center height of the silicon layer.

* * * * *